(12) United States Patent
Hamamura

(10) Patent No.: US 6,775,710 B1
(45) Date of Patent: Aug. 10, 2004

(54) PATH DETERMINATION METHOD AND COMPUTER-READABLE STORAGE MEDIUM DETERMINING A PATH WITHIN A PATH DETERMINATION REGION WITH AN IMPROVED UTILIZATION EFFICIENCY

(75) Inventor: Hirofumi Hamamura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 750 days.

(21) Appl. No.: 09/678,669

(22) Filed: Oct. 4, 2000

(30) Foreign Application Priority Data

Dec. 1, 1999 (JP) .......................................... 11-342306

(51) Int. Cl.$^7$ ............................................ G06F 15/173
(52) U.S. Cl. ...................... 709/238; 709/235; 370/351
(58) Field of Search ................. 709/238, 239, 709/240, 241, 242, 235; 370/257, 351, 392

(56) References Cited

U.S. PATENT DOCUMENTS

| | | | | |
|---|---|---|---|---|
| 5,375,069 A | * | 12/1994 | Satoh et al. | ................... 716/14 |
| 5,402,359 A | * | 3/1995 | Oyanagi | ...................... 716/12 |
| 5,519,631 A | * | 5/1996 | Nishioka et al. | .............. 716/10 |
| 5,583,788 A | * | 12/1996 | Kuribayashi | .................. 716/14 |
| 6,295,634 B1 | * | 9/2001 | Matsumoto | ................... 716/12 |
| 6,327,694 B1 | * | 12/2001 | Kanazawa | ..................... 716/7 |
| 6,415,427 B2 | * | 7/2002 | Nitta et al. | .................... 716/10 |

\* cited by examiner

*Primary Examiner*—Zarni Maung
(74) *Attorney, Agent, or Firm*—Staas & Halsey LLP

(57) ABSTRACT

A path determination method includes the steps of (a) determining a path in a first region which has a utilization efficiency less than a predetermined value probability-wise, (b) determining a path in a second region which is different from the first region when the utilization efficiency of the first region exceeds a second predetermined value, where the second region has a utilization efficiency exceeding the first predetermined value probability-wise, (c) dividing an entire region which is to be subjected to a path determination into partial regions of predetermined sizes and using the partial regions as a minimum unit of path search, (d) assigning to each of the partial regions a state quantity which is described by a path accommodating capacity within each of the partial regions, and (e) searching a path between two points by controlling a search speed depending on a change in the state quantity between adjacent partial regions.

17 Claims, 8 Drawing Sheets

PATH DETERMINATION METHOD AND COMPUTER-READABLE STORAGE MEDIUM DETERMINING A PATH WITHIN A PATH DETERMINATION REGION WITH AN IMPROVED UTILIZATION EFFICIENCY

BACKGROUND OF THE INVENTION

This application claims the benefit of a Japanese Patent Application No. 11-342306 filed Dec. 1, 1999, in the Japanese Patent Office, the disclosure of which is hereby incorporated by reference.

1. Field of the Invention

The present invention generally relates to path determination methods and storage media, and more particularly to a path determination method for automatically determining a path such as a wiring route within a wiring region, a communication route within a communication network and a moving route within a transportation system, and to a computer-readable storage medium which stores a program for causing a computer to automatically determine a path by such a path determination method.

Conventionally, there are techniques which use a computer to automatically determine a path, such as a wiring route within a wiring region of a semiconductor integrated circuit or a printed circuit, a communication route within a communication network, and a moving route within a transportation system. Various wiring techniques for determining the wiring route, various routing techniques for determining the communication route, and various navigation techniques for determining a moving route have been proposed.

2. Description of the Related Art

For example, the design of the wirings within the wiring region of the semiconductor integrated circuit or the printed circuit is becoming increasingly difficult due to the recent improvements in the integration density of circuits and circuit elements. For this reason, the wiring routes of large scale integrated (LSI) circuits and the like are determined by an automatic wiring technique which uses computer aided design (CAD).

According to the automatic wiring technique, the wirings are determined starting from an arbitrary wiring. If the wirings overlap, the designer manually searches for a wiring route which will not overlap with another wiring route, and corrects the overlapping wiring route by rerouting the wiring route. Accordingly, in the case of the LSI circuit or the like, it requires a skilled designer to correct the wiring route in such a manner, because a plurality of wiring layers exist and the wiring is extremely complex. In addition, it takes considerable time for the designer to correct the wiring route in such a manner, and as a result, it takes a long time to determine the final wiring route.

Furthermore, a wiring route between two points within the wiring region has a tendency of concentrating at a specific portion of the wiring region. Generally, the wiring routes concentrate more at a central portion of the wiring region than at other portions of the wiring region. But when the wiring routes are locally concentrated within the wiring region, the probability of overlapping wirings increases, and a wiring success rate decreases. The wiring success rate indicates a rate at which the wirings are successfully routed without overlap. Accordingly, the designer must frequently carry out the operation of manually searching for the wiring route which will not overlap with other wiring routes and correct the overlapping wiring route by rerouting the wiring route.

However, when the wiring routes are locally concentrated, there are cases where an appropriately rerouted wiring route cannot be provided as the number of wiring routes increases, due to the local concentration of the wiring routes within the wiring region, even if unused portions where the wiring routes can be provided still exist within the wiring region. In such cases, it is necessary to greatly modify the wiring design, and there is a problem in that it takes an extremely long time to carry out the wiring design.

In addition, the local concentration of the wiring routes can only be managed by the designer. As a result, the utilization efficiency of the wiring region is entirely dependent on the skills and experiences of the designer. Hence, there is a problem in that it is difficult to maintain the utilization efficiency of the wiring region above a predetermined value regardless of the level of skills and experiences of the designer. On the other hand, as the number of wiring routes increases, the wiring success rate decreases, and it is becoming virtually impossible for the designer to satisfactorily carry out the operations such as managing the local concentration of the wiring routes and providing appropriately rerouted wiring routes.

The problems described above are not peculiar to the wiring technique which determines the wiring route. Similar problems also occur in the case of the routing technique which determines the communication route, and the navigation technique which determines the moving route. In other words, the communication routes have the tendency of locally concentrating in the case of the communication network, and the moving routes have the tendency of locally concentrating in the case of the transportation system. For this reason, there are not only demands to solve the problems described above with respect to the wiring technique which determines the wiring route, but also to realize a routing technique which can determine the communication route within the communication network within a short time at a high success rate, and to realize a navigation technique which can determine the moving route within the transportation system within a short time at a high success rate.

SUMMARY OF THE INVENTION

Accordingly, it is a general object of the present invention to provide a novel and useful path determination method and computer-readable storage medium, in which the problems described above are eliminated.

Another and more specific object of the present invention is to provide a path determination method and a computer-readable storage medium, which can determine a path within a path determination region in which the path is to be determined, within a short time at a high success rate, and improve the utilization efficiency of the path determination region.

Still another object of the present invention is to provide a path determination method comprising the steps of (a) determining a path in a first region which has a utilization efficiency less than a predetermined value probability-wise, (b) determining a path in a second region which is different from the first region when the utilization efficiency of the first region exceeds a second predetermined value, where the second region has a utilization efficiency exceeding the first predetermined value probability-wise, (c) dividing an entire region which is to be subjected to a path determination into partial regions of predetermined sizes and using the partial regions as a minimum unit of path search, (d) assigning to each of the partial regions a state quantity which is described by a path accommodating capacity within each of the partial regions, and (e) searching a path between two points by controlling a search speed depending on a change in the state quantity between adjacent partial regions. According to the path determination method of the present invention, it is possible to determine a path within a path determination region in which the path is to be determined, within a short time at a high success rate, and improve the utilization efficiency of the path determination region.

The state quantity may be formed by a heat capacity. In addition, the region which is to be subjected to the path determination may be formed by a wiring region, the path may be formed by a wiring route within the wiring region, and one of the partial regions may be determined by two terminals within the wiring region. In this case, it is possible to improve the wiring technique for determining the wiring within integrated circuits, wiring boards and the like.

The path may be formed by a communication route within a communication network, one of the partial regions may be determined by two nodes within the communication network, and the state quantity may be formed by a band of the communication network. In this case, it is possible to improve the routing technique for determining the communication route within the communication system.

The path may be formed by a moving route within a transportation system, one of the partial regions may be determined by an entrance point and an exit point within the transportation system, and the state quantity may be formed by a width of the moving path within the transportation system. In this case, it is possible to improve the navigation technique for determining the moving route within the transportation system.

A further object of the present invention is to provide a computer-readable storage medium which stores a program for causing a computer to determine a path, comprising means for causing the computer to determine a path in a first region which has a utilization efficiency less than a predetermined value probability-wise, means for causing the computer to determine a path in a second region which is different from the first region when the utilization efficiency of the first region exceeds a second predetermined value, where the second region has a utilization efficiency exceeding the first predetermined value probability-wise, means for causing the computer to divide an entire region which is to be subjected to a path determination into partial regions of predetermined sizes and using the partial regions as a minimum unit of path search, means for causing the computer to assign to each of the partial regions a state quantity which is described by a path accommodating capacity within each of the partial regions, and means for causing the computer to search a path between two points by controlling a search speed depending oh a change in the state quantity between adjacent partial regions. According to the computer-readable storage medium of the present invention, it is possible to determine a path within a path determination region in which the path is to be determined, within a short time at a high success rate, and improve the utilization efficiency of the path determination region.

Other objects and further features of the present invention will be apparent from the following detailed description when read in conjunction with the accompanying drawings.

DESCRIPTION OF THE PREFERRED EMBODIMENTS

First, a description will be given of a first embodiment of a path determination method according to the present invention. In this embodiment, the present invention is applied to a wiring technique.

When designing wirings with high-density and high-integration for very large scale integrated (VLSI) circuits, high-density printed circuits and the like, candidates of a route between two points to be connected by a wiring have a tendency of concentrating at a central portion of a wiring region. When such a phenomenon in which the wirings locally concentrate within the wiring region where the wirings are to be determined, occurs at one or more locations within the wiring region, there are many cases where the wiring becomes impossible.

Hence, in order to avoid the local concentration of the wirings within the wiring region, this embodiment uses with a priority over other regions a first region which has a low utilization efficiency probability-wise during a wiring process, and after the utilization efficiency of this first region increases to a certain extent, releases for the wiring use a second region which has a high utilization efficiency probability-wise. As a result, it is possible to uniformly utilize the entire wiring region, thereby improving the utilization efficiency of the wiring region and improving the wiring success rate.

Figure 1:
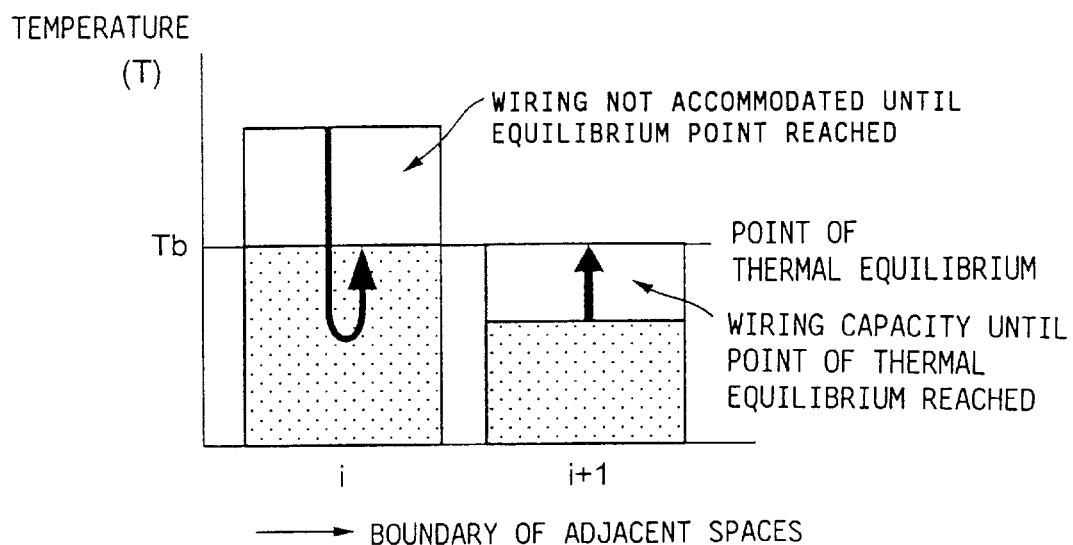
FIG. 1 is a diagram for explaining a thermal model.

The release of each region for the wiring use can be controlled dynamically using models of thermal equilibrium and heat conduction. FIG. 1 is a diagram for explaining a thermal model. In FIG. 1, the ordinate indicates a temperature T, and the abscissa indicates boundaries of adjacent spaces. In addition, Tb indicates a temperature at a point of thermal equilibrium, and i and i+1 indicate adjacent spaces.

In this embodiment, the search for a wiring route between two points is made based on a heat conduction model, using a maze running router technique. More particularly, the entire wiring region is divided into partial regions having predetermined sizes. Each partial region forms a minimum unit of the wiring route search, and is hereinafter referred to as a "space". A state quantity which is described by an accommodating capacity of the wirings within a space is assigned to each space, and the wiring route between the two points is searched by controlling a search speed depending on a change in the state quantity between adjacent spaces. In the case of this embodiment, the state quantity corresponds to the temperature, and the change in the state quantity between the adjacent spaces corresponds to a magnitude of a temperature gradient between the adjacent spaces. For this reason, the propagation speed of the search waves according to the maze running router technique is controlled depending on the magnitude of the temperature gradient between the adjacent spaces, and in this specification, such a wiring route search will be called a "variable-speed maze running router technique" as will be described later. According to the variable-speed maze running router technique, the wiring route is formed in units of the spaces. Hence, the determination of the wiring route according to this embodiment is suited for determining a general wiring route.

Of course, basic algorithms for search other than the maze running router technique may be used in this embodiment. For example, a line search router technique may be used as the basic algorithm for search.

Next, a description will be given of (1.1) space division and definition of wiring resource, (1.2) setting of state quantity, (1.3) calculation of state change, and (1.4) method of determining wiring route.

(1.1) Space Division and Definition of Wiring Route

Figure 2A:
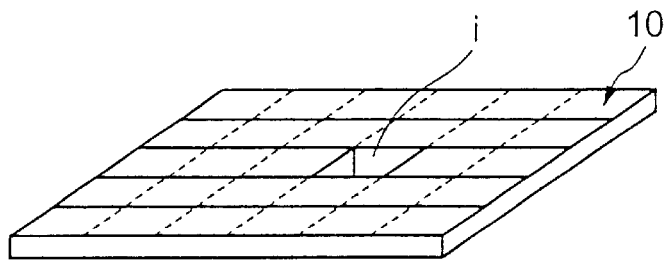
FIGS. 2A and 2B are diagrams for explaining a space division and a capacity model.
Figure 2B:
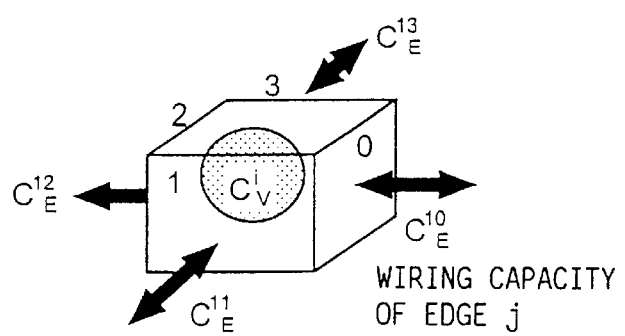

FIGS. 2A and 2B are diagrams for explaining a space division and a capacity model. FIG. 2A shows a model of a space i, and FIG. 2B shows a capacity model.

As shown in FIG. 2A, an arbitrary space i is defined as one cube which is obtained by dividing an entirety of a wiring region 10 on a wiring board, for example, into predetermined sizes. The wiring region 10 does not necessarily have to be divided uniformly.

As shown in FIG. 2B, the space i is made up of four side surfaces j (j=0 to 3) called edges, and a set of via holes which extend between wiring layers and exist within the space i and are called vias. Each edge j has a wiring capacity $C^{ij}_E$ which indicates a number of wirings which can pass through, and the via set has a via capacity $C^i_V$ which indicates a number of vias which can be used. The capacities $C^{ij}_E$ and $C^i_V$ represent wiring resources within the space i.

(1.2) Setting of State Quantity

First, a prediction of wiring request quantities and an initial temperature distribution are obtained as follows. That is, with respect to the edges and the via set of all of the spaces i within the wiring region 10, the wiring request quantities which are likely to be used throughout the entire wiring process are obtained by the following formulas (1) and (2) based on probability, and the obtained wiring request quantities are respectively used as initial values $T_{E0}$ and $T_{V0}$.

$$T^{ij}_{E0} = \text{Initial Temperature of Edge } j \tag{1}$$

$$= \sum_{e=0}^{wire-1} (1/We)/C^{ij}_E$$

In the formula (1), ij denotes the edge j (j=0 to 3) of the space i, We denotes a total number of edges within a minimum rectangle surrounding two pins which are to be connected by a wiring, $C^{ij}_E$ denotes an edge capacity of the edge j, and wire denotes a total number of wirings.

$$T^i_{V0} = \text{Initial Temperature of Via Set} \tag{2}$$

$$= \sum_{e=0}^{wire-1} (1/Se)/C^i_V$$

In the formula (2), Se denotes a total number of spaces within a minimum rectangle surrounding two pins which are to be connected by a wiring, $C^i_V$ denotes a via capacity of the space i, and wire denotes a total number of wirings.

Figure 3:
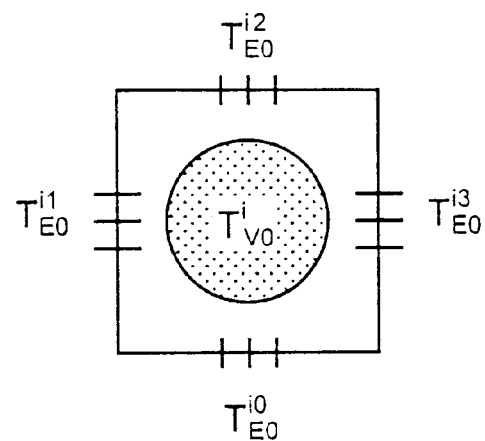
FIG. 3 is a diagram showing an initial temperature of a space i.
Figure 4:
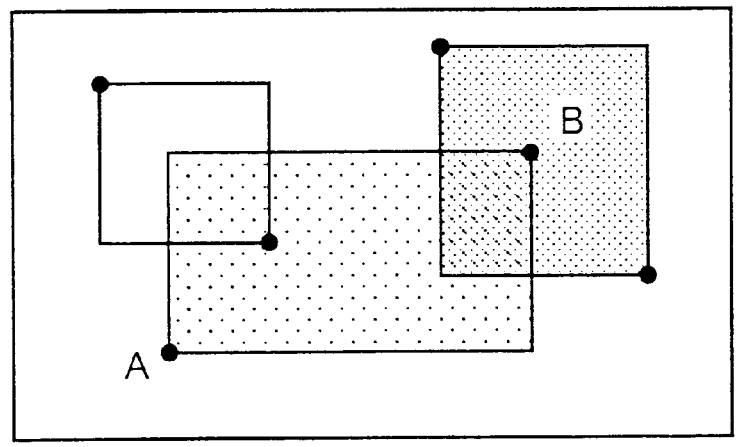
FIG. 4 is a diagram showing a region which has a probability of being used by a wiring between two pins A and B.

FIG. 3 is a diagram showing an initial temperature of the space i. In addition, FIG. 4 is a diagram showing a region which has a probability of being used by a wiring between two pins A and B.

The wiring resources and the heat capacity are obtained as follows. In other words, the edge capacities $C^{ij}_E$ of the four edges in the space i, where j=0, 1, 2 and 3, and the via capacity $C^i_V$ are used as the wiring resources, and made to correspond to the heat capacity.

In addition, the using quantity and the heat quantity of the wiring resources are obtained as follows. That is, in the actual wiring process, the number of wirings passing each edge j and the using quantity of the vias within each space i are as follows, and correspond to the heat quantity.

Edge Using Quantity $Q^{ij}_E$ (j=0, 1, 2, 3)

Via Using Quantity $Q^i_V$

Wiring state functions and temperature change are obtained as follows. Quantities indicating using states of the four edges and the via set of each space i can be described by the following formulas (3) and (4), and made to correspond to the temperature change.

$$T^{ij}_E = \text{Edge State Function} \tag{3}$$

$$= T^{ij}_{E0} \pm \Delta T^{ij}_E$$

$$T^i_V = \text{Via State Function} \tag{4}$$

$$= T^i_{V0} \pm \Delta T^i_V$$

A relationship described by the following formula (5) stands between a temperature change $\Delta T$, a heat quantity change $\Delta Q$, and a heat capacity C.

$$\Delta T = (1/c) \times \Delta Q \tag{5}$$

(1.3) Calculation of State Change

Based on the concept of heat conduction and thermal equilibrium, the change of state during the wiring process is formed into a model as described hereunder.

If a moving route of one unit of the heat quantity is made to correspond to the wiring route (wire) between two pins, and a temperature rise $\Delta T^{ij}_E$ after the one unit of heat quantity moves over the edge j of the space i is denoted by $\Delta T^{ij}_E = 1/C^{ij}_E$, a temperature $T^{ij}_E$ of the edge j after the move is described by $T^{ij}_E \leftarrow T^{ij}_E + \Delta T^{ij}_E$. Similarly, a temperature rise $\Delta T^i_V$ for a case where the moving route of the heat quantity changes direction in the space i, that is, a via is used, is described by $\Delta T^i_V = 1/C^i_V$, and a temperature $T^i_V$ of the space i after the move is described by $T^{ij}_E \leftarrow T^i_V + \Delta T^i_V$.

On the other hand, a reaction to the temperature rise $\Delta T^{ij}_E$ caused by one unit of the heat quantity passing over the edge j of the space i and the temperature rise $\Delta T^i_V$ caused by the use of the via, that is, a phenomenon which occurs to approach an equilibrium state, may be regarded as follows. In other words, it may be regarded that, with respect to the temperatures of the edge j and the via set of the space i, the heat quantities of the edge and the via set of each space k (k=1, . . . , m) satisfying a relationship $T^j < T^k$ move to the edge j and the via set of the space. The heat quantities which move are respectively proportional to a temperature gradient $\tau_{jl}$ (l=1, . . . , p) of the edge j and the via set, and inversely proportional to a distance $d_{jl}$.

Figure 5:
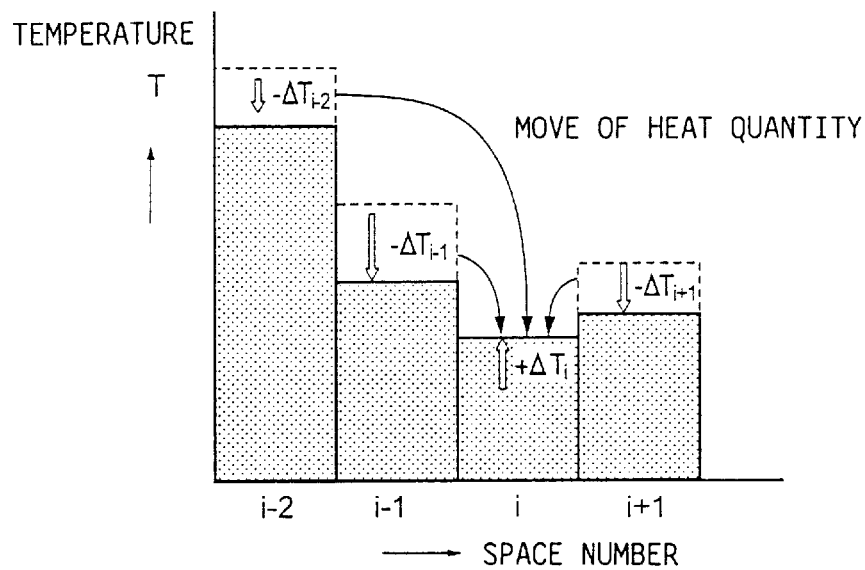
FIG. 5 is a diagram for explaining a temperature change in the space i.

In this case, it is assumed that the temperature falls in the following manner. FIG. 5 is a diagram for explaining the temperature change in the space i. In FIG. 5, the ordinate indicates the temperature T, and the abscissa indicates the space number. In other words, a temperature change $T^{kl}_E$ of the edge j of the space k is described by $T^{kl}_E \leftarrow T^{kl}_E - (1/C^{kl}_E)\{(\tau_{jl}/d_{jl})/(\tau_{jl}/d_{jl} + \ldots + \tau_{jp}/d_{jp})\}$, and a temperature change $T^k_V$ of the via set of the space k is described by $T^k_V \leftarrow T^k_V - (1/C^k_V)\{(\tau_{ij}/d_{ik})/(\tau_{il}/d_{il} + \ldots + \tau_{ik}/d_{ik})\}$.

(1.4) Method of Determining Wiring Route

The basic algorithm which is used in this embodiment to search the wiring route between two pins, is the so-called maze running router technique. In other words, the wiring route search is carried out with a propagation speed of the search waves set to a ratio of the temperature gradients τ between the edges of the space which are obtained as described above. In addition, although the conventional maze running router technique carries out a constant speed search, this embodiment carries out a variable-speed search. Hence, the algorithm for search employed in this embodiment will be referred to as the variable-speed maze running router technique.

Figure 6:
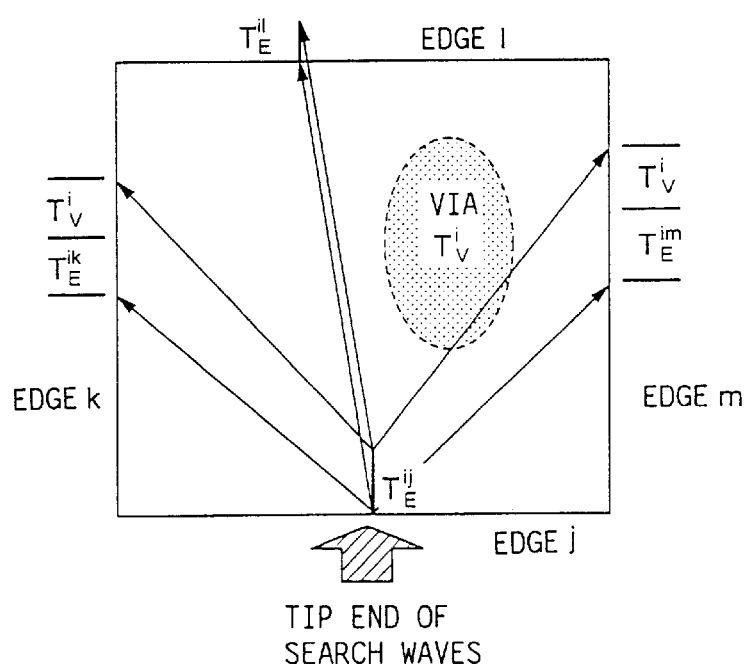
FIG. 6 is a diagram for explaining a temperature gradient between edges in the space i.

The temperature gradients are defined as follows. FIG. 6 is a diagram for explaining a temperature gradient between the edges of a target space i. In FIG. 6, an arrow with the hatching indicates a tip end of the search wave. When an edge to which the search wave enters is denoted by j, and an edge confronting the edge j is denoted by m, the temperature gradient between the edges of the target space i can be described by $\tau_{jm} = T^j_E - T^m_E$ if the edges m and j are in a facing relationship, and can be described by $\tau_{jm} = T^j_E - (T^m_E + \alpha XT^i_V)$ if the edges m and j are in a lateral relationship, where α denotes a constant.

Figure 7:
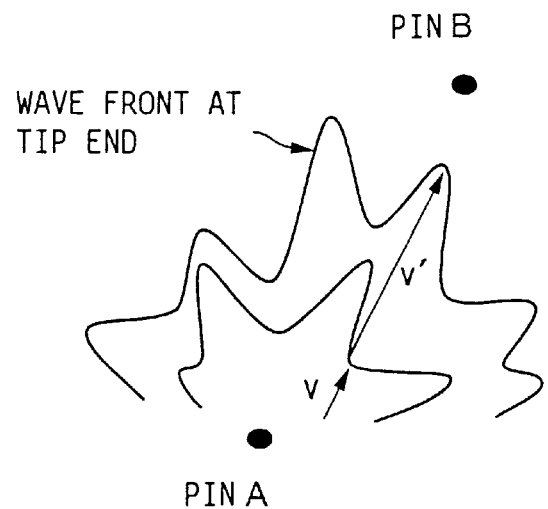
FIG. 7 is a diagram for explaining propagation waveforms of a variable-speed maze running router technique.
Figure 8:
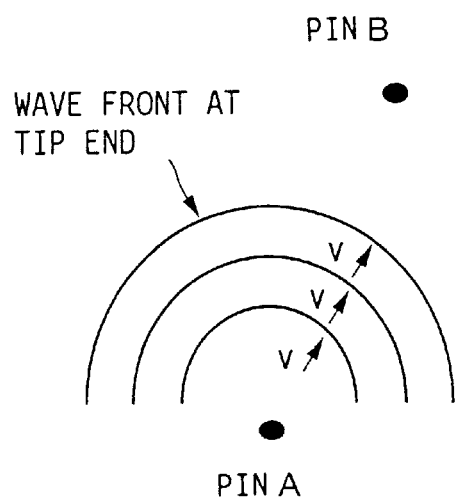
FIG. 8 is a diagram for explaining propagation waveforms of a conventional maze running router technique.

In addition, the wave propagation speed is defined as follows. FIG. 7 is a diagram for explaining propagation waveforms of the variable-speed maze running router technique, and FIG. 8 is a diagram for explaining propagation waveforms of the conventional maze running router technique for comparison purposes.

It is assumed that the search waves from the edge j of the target space i to confronting three sides k, l and m within the same target space i propagate towards the side having a positive temperature gradient. It is also assumed that wave propagation speeds $V_{jk}$, $V_{jl}$ and $v_{jm}$ of the search waves respectively towards the three sides k, l and m are proportional to relative values of the temperature gradients between the confronting edges. In other words, it is assumed that $V \propto \tau$.

A tip end W of the search waves propagates in a wave-like manner as shown in FIG. 7, proportionally to the magnitude of the wave propagation velocity v which is given between the edges of each space. In addition, the wave propagation speed v of the search waves at each space is described by a wave number ω which is required to reach a confronting edge from a target edge. A relationship $\omega = 1/v$ stands between the wave number ω and the wave propagation speed v. Accordingly, compared to the conventional maze running router technique in which the wave propagation speed v is constant as shown in FIG. 8, the search waves change depending on a change in the wave propagation speed v as shown in FIG. 7 in the case of the variable-speed maze running router technique which is employed in this embodiment.

The unit interval of the wiring route search, that is, the wave number ω of the search waves propagating between the edges of the space, can be described by a normalized value described by the following formula (6), where the normalized value is obtained by normalizing an inverse number of the temperature gradient τ between each of the propagating edges by a maximum value 1 and a minimum value N. In the formula (6), ω and N are both positive integers.

$$1 \leq \omega \leq N \qquad (6)$$

Figure 9B:
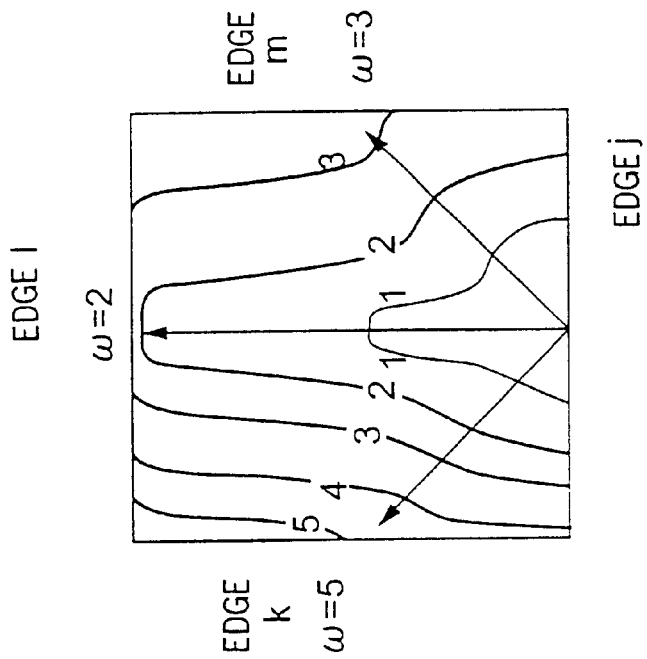
FIGS. 9A and 9B are diagrams for explaining propagation of search waves within the space.
Figure 9A:
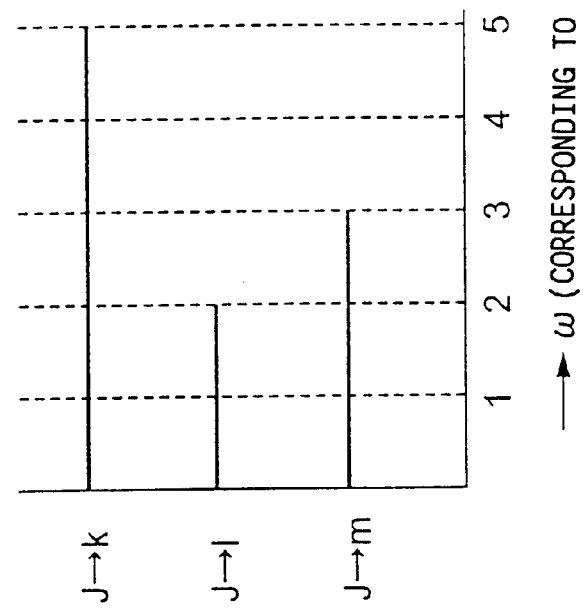

FIGS. 9A and 9B are diagrams for explaining the propagation of search waves within the space. More particularly, FIG. 9A shows the search waves within the space, and FIG. 9B shows the wave number ω, that is, a propagation time, with respect to each of the confronting three sides k, l and m within the space.

Figure 10:
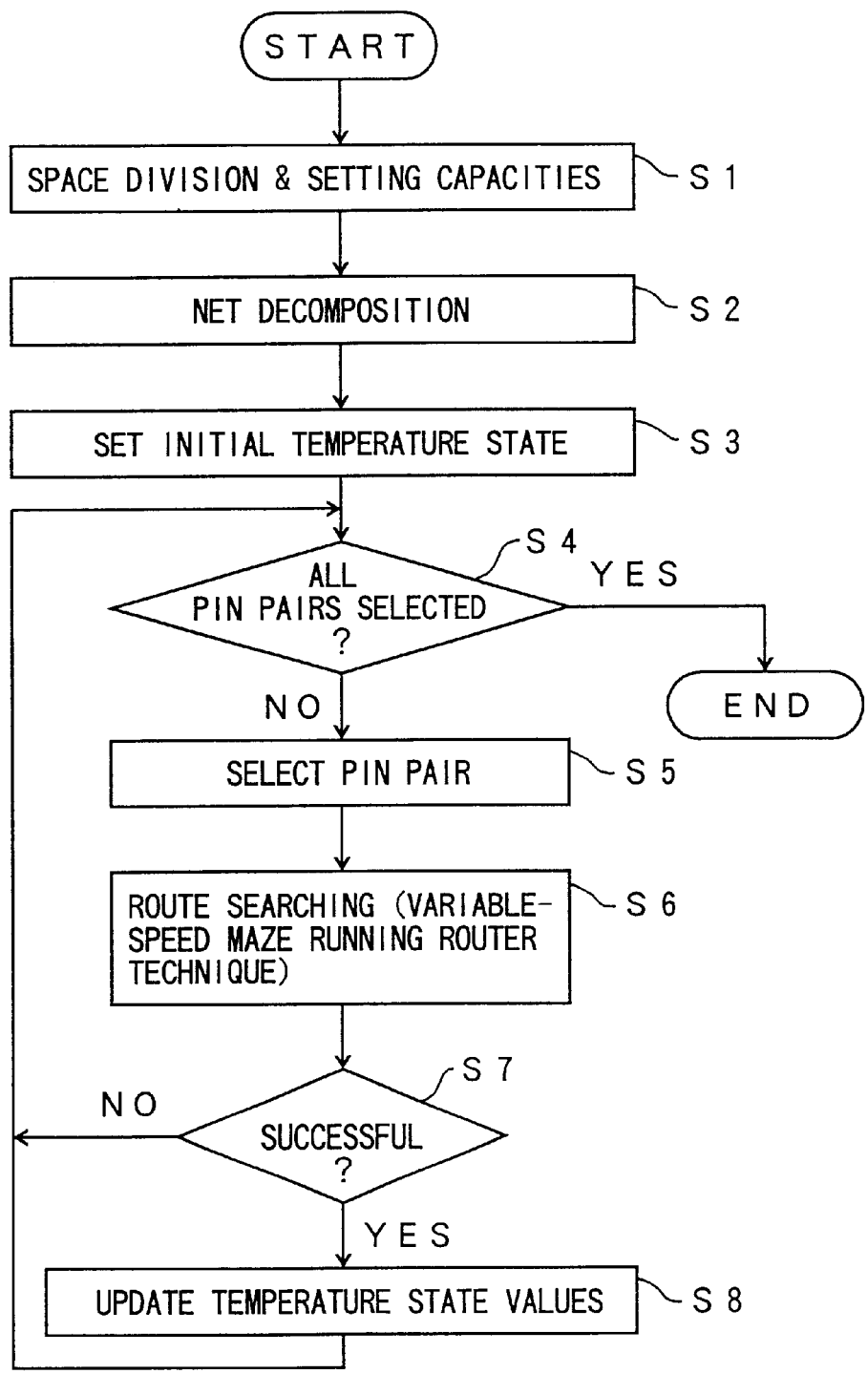
FIG. 10 is a flow chart for explaining a route searching process.

Next, a description will be given of a procedure of a route searching process of this embodiment, by referring to FIG. 10. FIG. 10 is a flow chart for explaining the route searching process.

In FIG. 10, a step S1 sets the space division and capacity. More particularly, the wiring region 10 shown in FIG. 2 is divided into the spaces having a size corresponding to x grids in the X-direction and y grids in the Y-direction, and the capacities $C^{ij}_E$ are assigned to the edges at the four sides of each space and the capacity $C^i_V$ is assigned to the via set of each space as described above under item (1.1).

A step S2 carries out a net decomposition. More particularly, all of the nets to be subjected to the wiring process are decomposed into pin pairs (wires) which are to be connected.

A step S3 sets the initial temperature state. More particularly, the initial temperatures of all of the spaces are obtained according to the formulas described above under item (1.2).

A step S4 decides whether or not all of the pin pairs have been selected. More particularly, a decision is made to determine whether or not the wiring is ended with respect to all of the pin pairs. The process ends if the decision result in the step S4 is YES. On the other hand, the process advances to a step S5 if the decision result in the step S4 is NO.

The step S5 selects the pin pair to be wired, one by one, in an order starting from the pin pair having the shortest wiring route.

A step S6 carries out the wiring route search based on the variable-speed maze running router technique described above. More particularly, the wiring route between the two pins A and B is obtained by employing the variable-speed maze running router technique. The propagation of the search waves is stopped at a point in time when a search wave from the pin A reaches the other target pin B or, the search wave hits an existing wiring (already wiring portion) within the same net (T-branch), and a route having a shortest distance is selected from the search waves which reaches the other target pin B or the existing wiring. The selected route having the shortest distance is decided as the wiring route between the pins A and B. In addition, it is judged that the wiring is impossible if the propagation waves do not reach the target pin B or the existing wiring even after the propagation waves pass through all of the spaces.

A step S7 decides whether or not the wiring route search is successful. More particularly, a judgement is made to determine whether the route is decided by the wiring route search or the route cannot be decided because the wiring is impossible. If the decision result in the step S7 is NO, the process returns to the step S4, so as to start the wiring route search with respect to the next pin pair. On the other hand, the process advances to a step S8 if the decision result in the step S7 is YES.

The step S8 updates the temperature states according to the formulas described above under item (1.3), with respect to the decided wiring route between the pins A and B. The process returns to the step S4 after the step S8.

If the decision result in the step S7 is NO, it is of course possible to record the location where the wiring is judged to be impossible or, to display the location together with an appropriate message.

Figure 11:
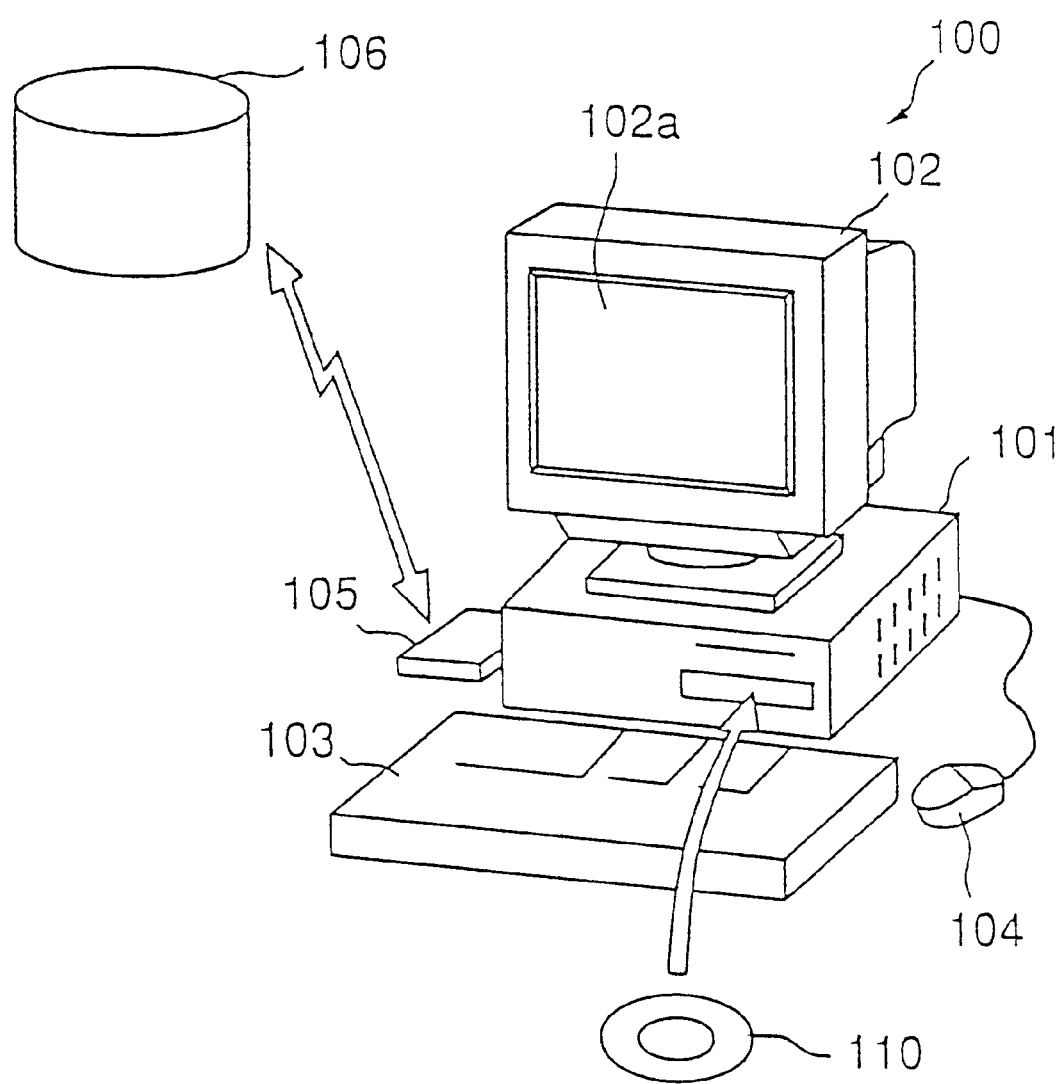
FIG. 11 is a perspective view showing a computer system which realizes an embodiment of a path determination method according to the present invention.

FIG. 11 is a perspective view showing a computer system which realizes this embodiment of the path determination method according to the present invention. This embodiment uses a desk-top type computer system, however, it is of course possible to similarly use a portable type computer system.

A computer system 100 shown in FIG. 11 generally includes a main body 101 which includes a CPU, a disk drive unit and the like, a display 102 having a display screen 102a for displaying an image in response to an instruction from the main body 101, a keyboard 103 for inputting various kinds of information to the computer system 100, a mouse 104 for specifying an arbitrary position on the display screen 102a of the display 102, and a modem 105 for accessing an external database or the like and downloading programs and the like stored in another computer system.

An automatic wiring program (software) for causing the computer system 100 to carry out an automatic wiring process, is stored in a portable recording medium such as a disk 110 or, is downloaded from a recording medium 106 of another computer system using a communication unit such as the modem 105. This automatic wiring program is input to the computer system 100 and is compiled therein. A computer-readable storage medium according to the present invention is formed by a recording medium such as the disk 110 which stores the program described above. The recording medium forming the computer-readable storage medium according to the present invention is not limited to portable recording media such as the disk 110, IC card memories, floppy disks, magneto-optical disks, CD-ROMs, but also includes various kinds of recording media which are accessible by a computer system which is connected via a communication means or communication unit such as the modem 105 and the LAN.

Figure 12:
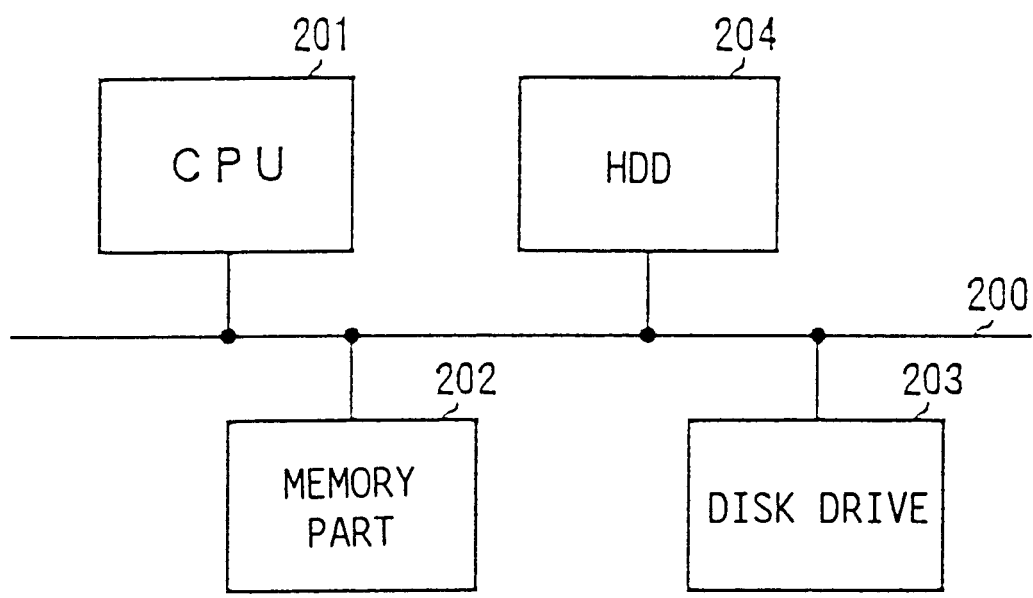
FIG. 12 is a system block diagram showing a construction of an important part of a main body of the computer system.

FIG. 12 is a system block diagram for explaining the construction of an important part within the main body 101 of the computer system 100. In FIG. 12, the main body 101 generally includes a CPU 201, a memory part 202 including a RAM, a ROM and the like, a disk drive 203 for the disk 110, and a hard disk drive 204 which are connected via a bus 200. For example, the disk drive 203 may be made up of a floppy disk drive unit for the floppy disk, and a CD-ROM drive unit for the CD-ROM. The display 102, the keyboard 103, the mouse 104 and the like may be connected to the CPU 201 via the bus 200, or directly connected to the CPU 201.

The construction of the computer system 100 is of course not limited to that shown in FIGS. 11 and 12, and various other constructions may be employed.

The automatic wiring program which is stored in this embodiment of the computer-readable storage medium according to the present invention includes a program portion which causes the CPU 201 to carry out at least the route searching process shown in FIG. 10.

The application of the present invention is not limited to the wiring technique which determines the wiring route. The present invention is similarly applicable to a routing technique which determines a communication route, a navigation technique which determines a moving route, and the like.

In the case of a communication network, there also is a tendency for the communication routes to concentrate locally. Hence, by applying the present invention to the routing technique which determines the communication route, it is possible to realize a routing technique which can determine the communication route within the communication network within a short time and with a high success rate.

Similarly, in the case of a transportation system, there also is a tendency for the moving routes to concentrate locally. Hence, by applying the present invention to the navigation technique which determines the moving route, it is possible to realize a navigation technique which can determine the moving route within the transportation system within a short time and with a high success rate.

More particularly, the path determination method should include a step of determining a path in a first region which has a utilization efficiency less than a predetermined value probability-wise, and a step of determining a path in a second region which is different from the first region when the utilization efficiency of the first region exceeds a second predetermined value, where the second region has a utilization efficiency exceeding the first predetermined value probability-wise. In this case, the first predetermined value and the second predetermined value may be mutually different or, equal to each other. In addition, the path determination method may further include a step of dividing the entire region which is to be subjected to the path determination into predetermined sizes and using partial regions resulting from the division as a minimum unit of the path search, a step of assigning to each of the partial regions a state quantity which is described by a path accommodating capacity within each of the partial regions, and a step of searching a path between two points by controlling a search speed depending on a change in the state quantity between adjacent partial regions.

In a case where the present invention is applied to the wiring technique, the region which is to be subjected to the path determination is a wiring region, and the path is a wiring route within the wiring region. Further, the partial region is determined by two terminals within the wiring region, and the change in the state quantity is a magnitude of a temperature gradient between the adjacent partial regions.

On the other hand, in a case where the present invention is applied to the routing technique which determines the communication route, the path is a communication route within the communication network, the partial region is determined by two nodes within the communication network, and the state quantity is a band of the communication network.

Moreover, in a case where the present invention is applied to the navigation technique which determines the moving route, the path is a moving route within the transportation system, and the partial region is determined by two points, namely, an entrance point and an exit point within the transportation system. The state quantity is a width of the moving route within the transportation system. For example, the width of the moving route is a width of a road.

Further, the present invention is not limited to these embodiments, but various variations and modifications may be made without departing from the scope of the present invention.

What is claimed is:

1. A path determination method comprising:
   determining a path in a first region which has a utilization efficiency less than a predetermined value probability-wise;
   determining a path in a second region which is different from the first region when the utilization efficiency of the first region exceeds a second predetermined value, where the second region has a utilization efficiency exceeding the first predetermined value probability-wise;
   dividing an entire region which is to be subjected to a path determination into partial regions of predetermined sizes and using the partial regions as a minimum unit of path search;
   assigning to each of the partial regions a state quantity which is described by a path accommodating capacity within each of the partial regions; and
   searching a path between two points by controlling a search speed depending on a change in the state quantity between adjacent partial regions.

2. The path determination method as claimed in claim 1, wherein the first predetermined value and the second predetermined value are mutually different or, equal to each other.

3. The path determination method as claimed in claim 1, wherein the state quantity is formed by a heat capacity.

4. The path determination method as claimed in claim 3, wherein the change in the state quantity is formed by a magnitude of a temperature gradient between the adjacent partial regions.

5. The path determination method as claimed in claim 3, wherein the region which is to be subjected to the path determination is formed by a wiring region, the path is formed by a wiring route within the wiring region, and one of the partial regions-is determined by two terminals within the wiring region.

6. The path determination method as claimed in claim 1, wherein the path is formed by a communication route within a communication network, one of the partial regions is determined by two nodes within the communication network, and the state quantity is formed by a band of the communication network.

7. The path determination method as claimed in claim 1, wherein the path is formed by a moving route within a transportation system, one of the partial regions is determined by an entrance point and an exit point within the transportation system, and the state quantity is formed by a width of the moving path within the transportation system.

8. A computer-readable storage medium which stores a program for causing a computer to determine a path, comprising:
   a procedure causing the computer to determine a path in a first region which has a utilization efficiency less than a predetermined value probability-wise;
   a procedure causing the computer to determine a path in a second region which is different from the first region when the utilization efficiency of the first region exceeds a second predetermined value, where the second region has a utilization efficiency exceeding the first predetermined value probability-wise;
   a procedure causing the computer to divide an entire region which is to be subjected to a path determination into partial regions of predetermined sizes and using the partial regions as a minimum unit of path search;
   a procedure causing the computer to assign to each of the partial regions a state quantity which is described by a path accommodating capacity within each of the partial regions; and
   a procedure causing the computer to search a path between two points by controlling a search speed depending on a change in the state quantity between adjacent partial regions.

9. The computer-readable storage medium as claimed in claim 8, wherein the first predetermined value and the second predetermined value are mutually different or, equal to each other.

10. The computer-readable storage medium as claimed in claim 8, wherein the state quantity is formed by a heat capacity.

11. The computer-readable storage medium as claimed in claim 10, wherein the change in the state quantity is formed by a magnitude of a temperature gradient between the adjacent partial regions.

12. The computer-readable storage medium as claimed in claim 10, wherein the region which is to be subjected to the path determination is formed by a wiring region, the path is formed by a wiring route within the wiring region, and one of the partial regions is determined by two terminals within the wiring region.

13. The computer-readable storage medium as claimed in claim 8, wherein the path is formed by a communication route within a communication network, one of the partial regions is determined by two nodes within the communication network, and the state quantity is formed by a band of the communication network.

14. The computer-readable storage medium as claimed in claim 8, wherein the path is formed by a moving route within a transportation system, one of the partial regions is determined by an entrance point and an exit point within the transportation system, and the state quantity is formed by a width of the moving path within the transportation system.

15. An apparatus for determining a path for use by a wiring technique that determines a wiring route, said apparatus comprising:
   a part configured to determine a path in a first region which has a utilization efficiency less than a predetermined value probability-wise;
   a part configured to determine a path in a second region which is different from the first region when the utilization efficiency of the first region exceeds a second predetermined value, where the second region has a utilization efficiency exceeding the first predetermined value probability-wise;
   a part configured to divide an entire region which is to be subjected to a path determination into partial regions of predetermined sizes and using the partial regions as a minimum unit of path search;
   a part configured to assign to each of the partial regions a heat capacity which is described by a path accommodating capacity within each of the partial regions; and
   a part configured to search a path between two points by controlling a search speed depending on a change in the heat capacity between adjacent partial regions,
   wherein the region which is to be subjected to the path determination is formed by a wiring region, the path is a wiring route within the wiring region and the partial region is determined by two terminals within the wiring region, and
   the change in the heat capacity is a magnitude of a temperature gradient between the adjacent partial regions.

16. An apparatus for determining a path for use by a routing technique that determines a communication route, said apparatus comprising:

a part configured to determine a path in a first region which has a utilization efficiency less than a predetermined value probability-wise;

a part configured to determine a path in a second region which is different from the first region when the utilization efficiency of the first region exceeds a second predetermined value, where the second region has a utilization efficiency exceeding the first predetermined value probability-wise;

a part configured to divide an entire region which is to be subjected to a path determination into partial regions of predetermined sizes and using the partial regions as a minimum unit of path search;

a part configured to assign to each of the partial regions a state quantity which is described by a path accommodating capacity within each of the partial regions; and a part configured to search a path between two points by controlling a search speed depending on a change in the state quantity between adjacent partial regions, wherein the path is a communication route within a communication network and the partial region is determined by two nodes within the communication network, and the state quantity is a band of the communication network.

17. An apparatus for determining a path for use by a navigation technique that determines a moving route, said apparatus comprising:

a part configured to determine a path in a first region which has a utilization efficiency leas than a predetermined value probability-wise;

a part configured to determine a path in a second region which is different from the first region when the utilization efficiency of the first region exceeds a second predetermined value, where the second region has a utilization efficiency exceeding the first predetermined value probability-wise;

a part configured to divide an entire region which is to be subjected to a path determination into partial regions of predetermined sizes and using the partial regions as a minimum unit of path search;

a part configured to assign to each of the partial regions a state quantity which is described by a path accommodating capacity within each of the partial regions; and a part configured to search a path between two points by controlling a search speed depending on a change in the state quantity between adjacent partial regions, wherein the path is a moving route within a transportation system and the partial region is determined by an entrance point and an exit point within the transportation system, and the state quantity is a width of the moving route within the transportation system.

* * * * *

UNITED STATES PATENT AND TRADEMARK OFFICE
CERTIFICATE OF CORRECTION

PATENT NO.    : 6,775,710 B1
DATED         : August 10, 2004
INVENTOR(S)   : Hirofumi Hamamura It is certified that error appears in the above-identified patent and that said Letters Patent is hereby corrected as shown below:

Column 14,
Line 2, "leas" should be -- less --.

Signed and Sealed this

Twenty-eighth Day of December, 2004

JON W. DUDAS
*Director of the United States Patent and Trademark Office*